United States Patent
Lee et al.

(10) Patent No.: US 10,164,097 B2
(45) Date of Patent: Dec. 25, 2018

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Yen-Ru Lee, Hsinchu (TW); Chii-Horng Li, Hsinchu County (TW); Heng-Wen Ting, Hsinchu (TW); Tzu-Hsiang Hsu, Hsinchu County (TW); Chih-Yun Chin, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/852,441

(22) Filed: Sep. 11, 2015

(65) Prior Publication Data

US 2017/0077300 A1    Mar. 16, 2017

(51) Int. Cl.
| | |
|---|---|
| *H01L 29/78* | (2006.01) |
| *H01L 29/06* | (2006.01) |
| *H01L 29/08* | (2006.01) |
| *H01L 29/66* | (2006.01) |
| *H01L 29/165* | (2006.01) |

(52) U.S. Cl.
CPC ...... *H01L 29/7848* (2013.01); *H01L 29/0653* (2013.01); *H01L 29/0847* (2013.01); *H01L 29/66795* (2013.01); *H01L 29/7851* (2013.01); *H01L 29/165* (2013.01)

(58) Field of Classification Search
CPC .................................................. H01L 29/7848
See application file for complete search history.

(56) References Cited

U.S. PATENT DOCUMENTS

| | | | |
|---|---|---|---|
| 2007/0075372 A1* | 4/2007 | Terashima ........ | H01L 29/42392 257/360 |
| 2007/0128782 A1* | 6/2007 | Liu ..................... | H01L 27/0207 438/187 |
| 2011/0147828 A1* | 6/2011 | Murthy ............. | H01L 21/02057 257/327 |
| 2011/0210404 A1* | 9/2011 | Su ......................... | H01L 29/785 257/401 |
| 2013/0277752 A1* | 10/2013 | Glass .............. | H01L 21/823821 257/369 |
| 2014/0203370 A1* | 7/2014 | Maeda .................. | H01L 29/785 257/365 |

* cited by examiner

*Primary Examiner* — Su C Kim
*Assistant Examiner* — David S Wilbert
(74) *Attorney, Agent, or Firm* — Maschoff Brennan

(57) ABSTRACT

A semiconductor device includes a substrate, at least one first isolation structure, at least two second isolation structures, and a plurality of epitaxy structures. The substrate has a plurality of semiconductor fins therein. The first isolation structure is disposed between the semiconductor fins. The semiconductor fins are disposed between the second isolation structures, and the second isolation structures extend into the substrate further than the first isolation structure. The epitaxy structures are respectively disposed on the semiconductor fins. The epitaxy structures are separated from each other, and at least one of the epitaxy structures has a substantially round profile.

20 Claims, 7 Drawing Sheets

SEMICONDUCTOR DEVICE AND MANUFACTURING METHOD THEREOF

BACKGROUND

Semiconductor devices are used in a large number of electronic devices, such as computers, cell phones, and others. Semiconductor devices include integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

In the race to improve transistor performance as well as reduce the size of transistors, transistors have been developed that the channel and source/drain regions are located in a fin formed from the bulk substrate. Such non-planar devices are multiple-gate FinFETs. A multiple-gate FinFET may have a gate electrode that straddles across a fin-like silicon body to form a channel region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
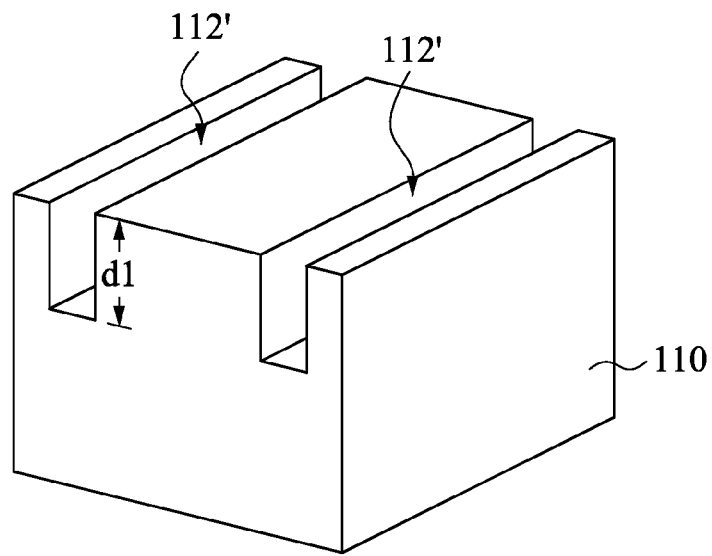
FIGS. 1 to 6, and 8 are perspective views of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 to 6 and 8 are perspective views of a method for manufacturing a semiconductor device at various stages in accordance with some embodiments of the present disclosure. Reference is made to FIG. 1. A substrate 110 is provided. In some embodiments, the substrate 110 may be a semiconductor material and may include known structures including a graded layer or a buried oxide, for example. In some embodiments, the substrate 110 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 110. Alternatively, the substrate 110 may be an active layer of a semiconductor-on-insulator (SOI) substrate or a multi-layered structure such as a silicon-germanium layer formed on a bulk silicon layer.

At least two trenches 112' are formed in the substrate 110. The trenches 112' may be formed using a masking layer (not shown) along with a suitable etching process. For example, the masking layer may be a hardmask including silicon nitride formed through a process such as chemical vapor deposition (CVD), although other materials, such as oxides, oxynitrides, silicon carbide, combinations of these, or the like, and other processes, such as plasma enhanced CVD (PECVD), low pressure CVD (LPCVD), or even silicon oxide formation followed by nitridation, may alternatively be utilized. Once formed, the masking layer may be patterned through a suitable photolithographic process to expose those portions of the substrate 110 that will be removed to form the trenches 112'.

As one of skill in the art will recognize, however, the processes and materials described above to form the masking layer are not the only method that may be used to protect portions of the substrate 110 while exposing other portions of the substrate 110 for the formation of the trenches 112'. Other suitable process, such as a patterned and developed photoresist, may alternatively be utilized to expose portions of the substrate 110 to be removed to form the trenches 112'. All such methods are fully intended to be included in the scope of the present disclosure.

Once a masking layer has been formed and patterned, the trenches 112' are formed in the substrate 110. The exposed substrate 110 may be removed through a suitable process such as reactive ion etching (RIE) in order to form the trenches 112' in the substrate 110, although other suitable processes may alternatively be used. In some embodiments, the trenches 112' may be formed to have a depth d1 be less than about 500 nm from the surface of the substrate 110, such as about 250 nm. As explained below with respect to FIG. 2, the area of the substrate 110 between the trenches 112' is subsequently patterned to form individual fins.

Figure 2:
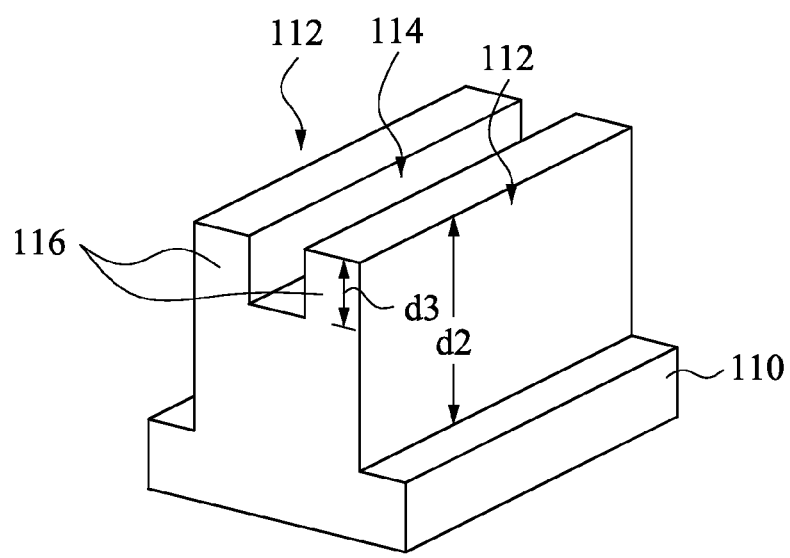

Reference is made to FIG. 2. For the sake of clarity, FIG. 2 has been enlarged from FIG. 1 to show the interior of the trenches 112' of FIG. 1. At least one trench 114 is formed between the trenches 112' of FIG. 1, and the trenches 112' are formed to be trenches 112. For example, in FIG. 2, the trench 114 is formed between the trenches 112. The trench 114 can be isolation regions between separate semiconductor fins 116 that share either a similar gate or similar sources or drains. The trenches 112 may be isolation regions located between fins that do not share a similar gate, source, or drain.

The trench 114 may be formed using a similar process as the trenches 112' (discussed above with respect to FIG. 1) such as a suitable masking or photolithography process followed by an etching process. Additionally, the formation of the trench 114 is also used to deepen the trenches 112' of FIG. 1, such that the trenches 112 extend into the substrate 110 a further distance than the trench 114. That is, the trenches 112 are deeper than the trench 114, and a bottom surface of the trench 112 is lower than a bottom surface of the trench 114. This may be done by using a suitable mask to expose both the trenches 112 as well as those areas of the substrate 110 that will be removed to form the trench 114. As such, the trenches 112 may have a second depth d2 of between about 20 nm and about 700 nm, such as about 320 nm, and the trench 114 may be formed to have a third depth d3 of between about 10 nm and about 150 nm, such as about 1000 nm. It is noted that although in FIG. 2 the trenches 112 and 114 have sharp corners, in some other embodiments, the trenches 112 and 114 may have round corners depending on the etching conditions.

However, as one of ordinary skill in the art will recognize, the process described above to form the trenches 112 and 114 is one potential process, and is not meant to be limited with this respect. Rather, other suitable process through which the trenches 112 and 114 may be formed such that the trenches 112 extend into the substrate 110 further than the trench 114 may be utilized. For example, the trenches 112 may be formed in a single etch step and then protected during the formation of the trench 114. Other suitable process, including any number of masking and removal processes may alternatively be used.

In addition to forming the trench 114, the masking and etching process additionally forms the semiconductor fins 116 from those portions of the substrate 110 that remain unremoved. These semiconductor fins 116 may be used, as discussed below, to form the channel region of the semiconductor device. While FIG. 2 illustrates two semiconductor fins 116 formed from the substrate 110, any number of semiconductor fins 116 that are greater than one may be utilized such that there are the trenches 112 and 114. In some embodiments, the semiconductor fins 116 may form a separate channel region while still being close enough to share a common gate (whose formation is discussed below in relation to FIG. 4).

Figure 3:
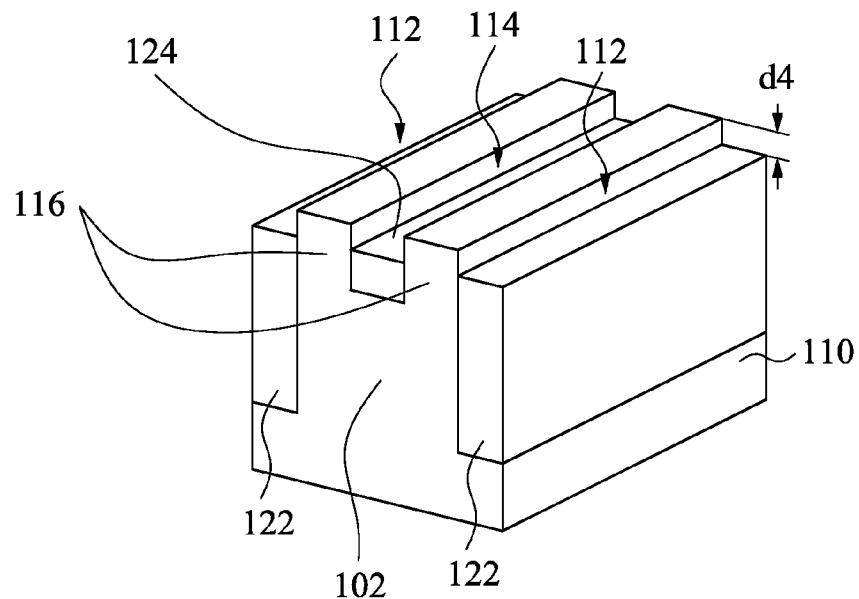

Reference is made to FIG. 3. The trenches 112 and 114 are filled with a dielectric material (not shown). The dielectric material is recessed within the trenches 112 and 114 to respectively form isolation structures 122 (referred as second isolation structures) and 124 (referred as a first isolation structure). In some embodiments, the isolation structures 122 extend into the substrate 110 further than the isolation structure 124. In other words, the isolation structures 122 are deeper than the isolation structure 124. The isolation structures 122 define a crown structure 102 in the substrate 110, and the isolation structure 124 defines a plurality of the semiconductor fins 116 in the crown structure 102. The dielectric material may be an oxide material, a high-density plasma (HDP) oxide, or the like. The dielectric material may be formed, after an optional cleaning and lining of the trenches 112 and 114, using either a CVD method (e.g., the high aspect ratio process (HARP) process), a high density plasma CVD method, or other suitable method of formation as is known in the art.

The trenches 112 and 114 may be filled by overfilling the trenches 112 and 114 and the substrate 110 with the dielectric material and then removing the excess material outside of the trenches 112 and 114 and substrate 110 through a suitable process such as chemical mechanical polishing (CMP), an etch, a combination of these, or the like. In some embodiments, the removal process removes any dielectric material that is located over the substrate 110 as well, so that the removal of the dielectric material will expose the surface of the substrate 110 to further processing operations.

Once the trenches 112 and 114 have been filled with the dielectric material, the dielectric material may then be recessed away from the surface of the substrate 110. The recessing may be performed to expose at least a portion of the sidewalls of the semiconductor fins 116 adjacent to the top surface of the substrate 110. The dielectric material may be recessed using a wet etch by dipping the top surface of the substrate 110 into an etchant such as HF, although other etchants, such as $H_2$, and other methods, such as a reactive ion etch, a dry etch with etchants such as $NH_3/NF_3$, chemical oxide removal, or dry chemical clean may alternatively be used. The dielectric material may be recessed to a fourth depth d4 from the surface of the substrate 110 of between about 5 nm and about 50 nm, such as about 40 nm. Additionally, the recessing may also remove any leftover dielectric material located over the substrate 110 to ensure that the substrate 110 is exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the trenches 112 and 114 with the dielectric material. All of the potential process steps are fully intended to be included within the scope of the present embodiment.

Figure 4:
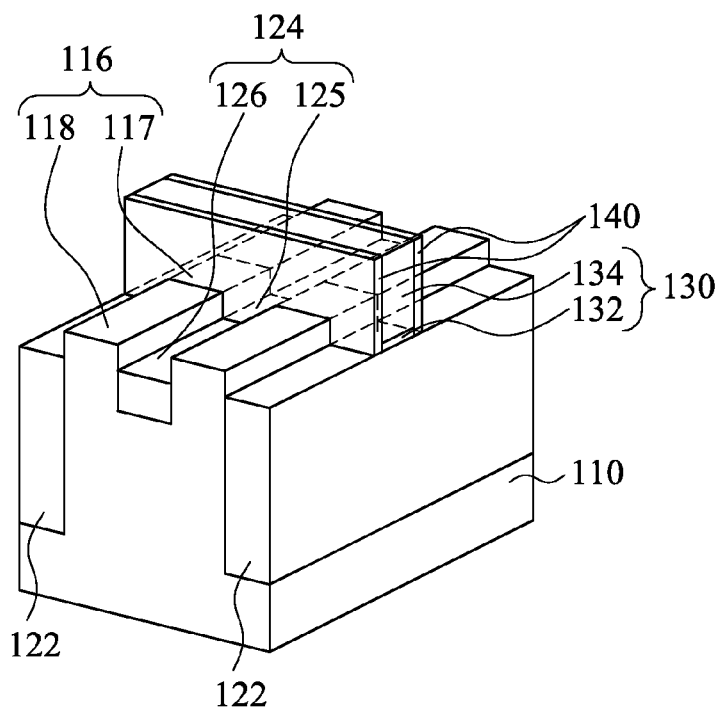

Reference is made to FIG. 4. A gate stack 130 is formed on portions of the semiconductor fins 116 and the isolation structures 122 and 124. The gate stack 130 includes a gate dielectric 132 and a gate electrode 134. The gate dielectric 132 may be formed by thermal oxidation, chemical vapor deposition, sputtering, or any other methods known and used in the art for forming a gate dielectric. Depending on the technique of gate dielectric formation, a thickness of the gate dielectric 132 on the top of the semiconductor fins 116 may be different from a thickness of the gate dielectric 132 on the sidewall of the semiconductor fins 116.

The gate dielectric 132 may includes a material such as silicon dioxide or silicon oxynitride with a thickness ranging from about 3 angstroms to about 100 angstroms, such as about 10 angstroms. The gate dielectric 132 may alternatively be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, combinations of silicon dioxide, silicon oxynitirde, and/or high-k materials may also be used for the gate dielectric 132.

The gate electrode 134 is formed on the gate dielectric 132. The gate electrode 134 may include a conductive material and may be selected from a group including of polycrystalline-silicon (poly-Si), poly-crystalline silicon-germanium (poly-SiGe), metallic nitrides, metallic silicides, metallic oxides, metals, combinations of these, and the like. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, etc.

The gate electrode 134 may be deposited by chemical vapor deposition (CVD), sputter deposition, or other techniques known and used in the art for depositing conductive materials. The thickness of the gate electrode 134 may be in the range of about 200 angstroms to about 4,000 angstroms. Ions may or may not be introduced into the gate electrode 134 at this process. Ions may be introduced, for example, by ion implantation techniques.

The gate stack 130 defines multiple channel regions (i.e., the first portions 117) located in the semiconductor fins 116 underneath the gate dielectric 132. The gate stack 130 may be formed by depositing and patterning a gate mask (not shown) on a gate electrode layer using, for example, deposition and photolithography techniques known in the art. The gate mask may incorporate commonly used masking materials, such as (but not limited to) photoresist material, silicon oxide, silicon oxynitride, and/or silicon nitride. A dry etching process may be used to form the patterned gate stack 130.

Once gate stack 130 is patterned, a pair of spacers 140 may be formed. The spacers 140 may be formed on opposing sides of the gate stack 130. The spacers 130 are typically formed by blanket depositing a spacer layer (not shown) on the previously formed structure. The spacer layer may include SiN, oxynitride, SiC, SiON, oxide, and the like and may be formed by methods utilized to form such a layer, such as chemical vapor deposition (CVD), plasma enhanced CVD, sputter, and other methods known in the art. The spacer layer may include a different material with different or the similar etch characteristics than the dielectric material of isolation structures 122 and 124. The spacers 140 may then be patterned, such as by one or more etches to remove the spacer layer from the horizontal surfaces of the structure.

In FIG. 4, at least one of the semiconductor fins 116 has at least one first portion 117 and at least one second portion 118. The gate stack 130 and the spacers 140 cover the first portion 117 while leaving the second portion(s) 118 uncovered. That is, the second portion(s) 118 is exposed by the gate stack 130 and the spacers 140. Moreover, the isolation structure 124 has at least one first portion 125 and at least one second portion 126. The gate stack 130 and the spacers 140 cover the first portion 125 while leaving the second portion(s) 126 uncovered. That is, the second portion(s) 126 is exposed by the gate stack 130 and the spacers 140.

Figure 5:
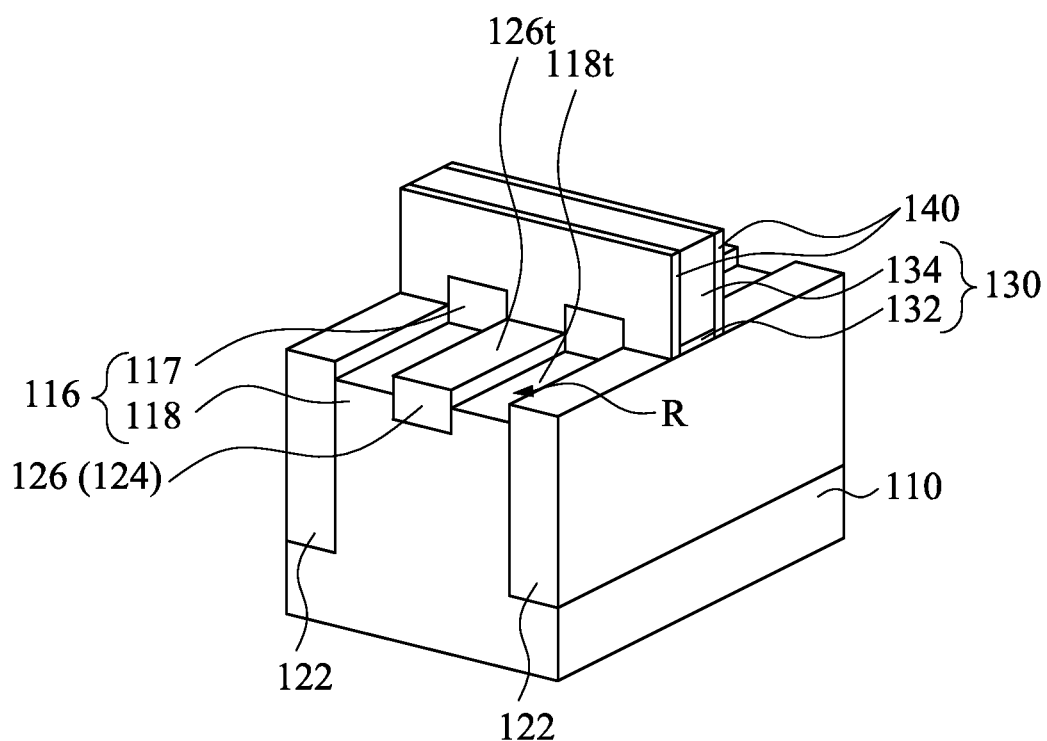

Reference is made to FIG. 5. Parts of the second portions 118 of the semiconductor fins 116 are removed from those areas not protected by the gate stack 130 and spacers 140, such that the sidewalls of the first portions 117 of the semiconductor fins 116 are exposed from the spacers 140. Top surfaces 118t of the remaining second portions 118 of the semiconductor fins 116 are below the top surface 126t of the second portion 126 of the isolation structure 124. Therefore, one of the isolation structures 122, the isolation structure 124, and one of the semiconductor fins 116 together form a recess R. This removal may be performed by a reactive ion etch (RIE) using the gate stacks 130 and first spacers 140 as hardmasks, or by any other suitable removal process. In some embodiments, the etching process may be performed under a pressure of about 1 mTorr to 1000 mTorr, a power of about 50 W to 1000 W, a bias voltage of about 20 V to 500 V, at a temperature of about 40° C. to 60° C., using a HBr and/or $Cl_2$ as etch gases. Also, in the embodiments provided, the bias voltage used in the etching process may be tuned to allow good control of an etching direction to achieve desired profiles for the remaining (or recessed) second portions 118 of the semiconductor fins 116. It is noted that although in FIG. 5 the remaining second portions 118 have sharp corners, in some other embodiments, the remaining second portions 118 may have round corners depending on the etching conditions.

Figure 6:
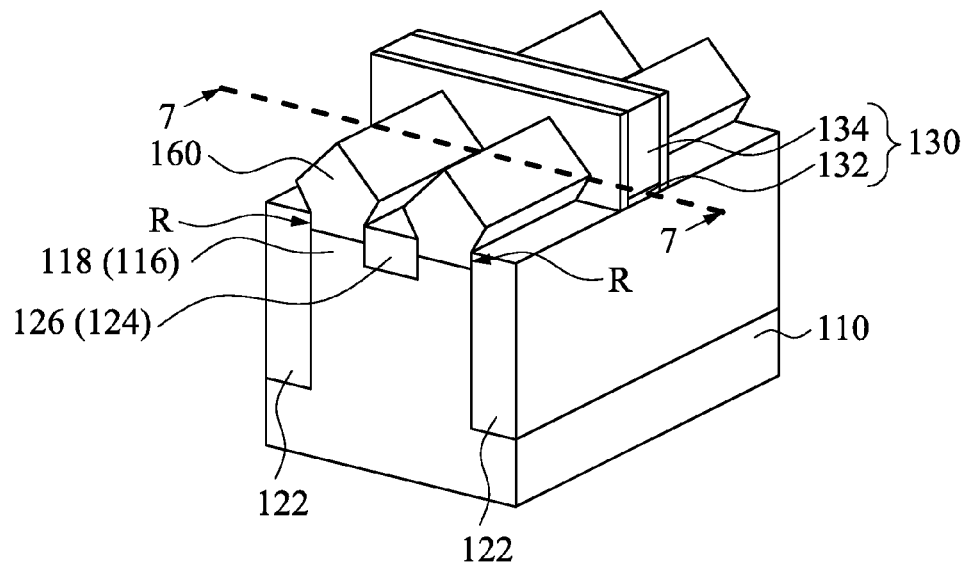
Figure 7:
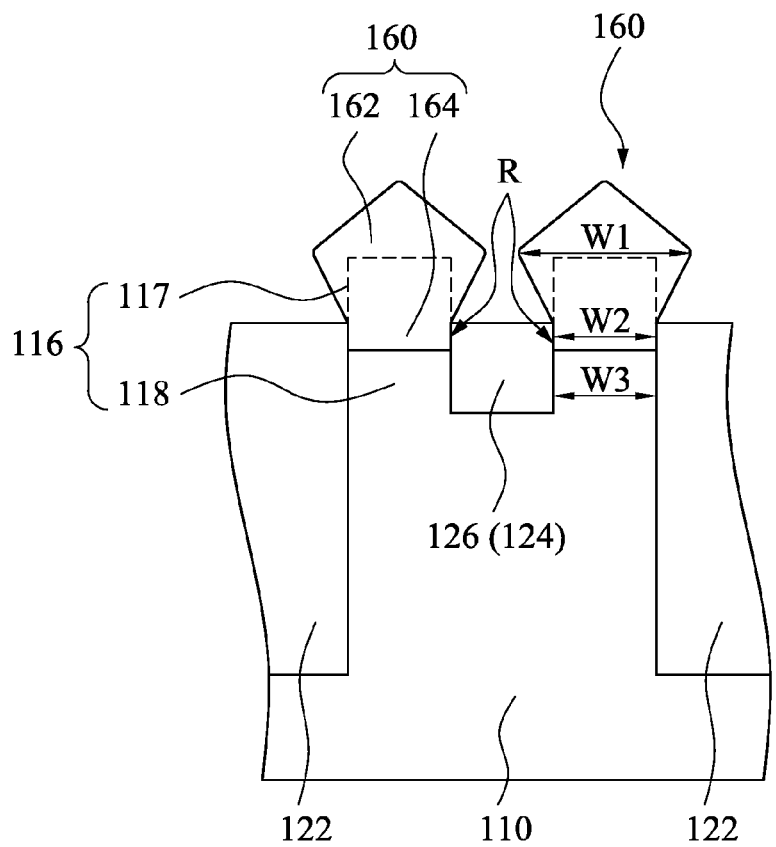
FIG. 7 is a cross-sectional view taking along line 7-7 of FIG. 6.

Reference is made to FIGS. 6 and 7, and FIG. 7 is a cross-sectional view taking along line 7-7 of FIG. 6. A plurality of epitaxy structures 160 are formed in the recesses R and on the remaining second portions 118 of the semiconductor fins 116. The second portion 126 of the isolation structure 124 is disposed between the epitaxy structures 160. Since the lattice constant of the epitaxy structures 160 is different from the substrate 110, the channel regions of the semiconductor fins 116 are strained or stressed to enable carrier mobility of the device and enhance the device performance. In some embodiments, the epitaxy structures 160, such as silicon carbon (SiC), are epi-grown by a LPCVD process to form source and drain regions of an n-type FinFET. The LPCVD process is performed at a temperature of about 400° C. to 800° C. and under a pressure of about 1 to 200 Torr, using $Si_3H_8$ and $SiH_3CH$ as reaction gases. In some embodiments, the epitaxy structures 160, such as silicon germanium (SiGe), are epi-grown by a LPCVD process to form source and drain regions of a p-type FinFET. The LPCVD process is performed at a temperature of about 400° C. to 800° C. and under a pressure of about 1 to 200 Torr, using $SiH_4$ and $GeH_4$ as reaction gases.

In FIG. 7, at least one of the epitaxy structures 160 has a top portion 162 and a body portion 164. The body portion 164 is disposed between the top portion 162 and one of the recessed second portions 118 of the semiconductor fin 116. The body portion 164 is further disposed in the recess R. The top portion 162 has a width W1, and the body portion 164 has a width W2 shorter than the width W1. At least one of the semiconductor fins 116 has a width W3 substantially the same as the width W2. The isolation structures 122 and 124 are disposed on opposite sides of the body portions 164 of the epitaxy structure 160, and the top portion 162 of the epitaxy structure 160 is disposed on the isolation structures 122 and 124.

In some embodiments, the top portion 162 is higher than or substantially equal to the first portion 117 of the semiconductor fin 116. That is, the sidewalls of the first portions 117 of the semiconductor fins 116 exposed the spacers 140 (see FIG. 5) are covered by the top portions 162 of the epitaxy structure 160. The top portion 162 may have facet surfaces. During the epitaxy process, the epitaxy growth of the epitaxy structures 160 may extends both vertically and laterally, such that the epitaxy structures 160 may be merged together (or physically connected) in some embodiments.

Figure 8:
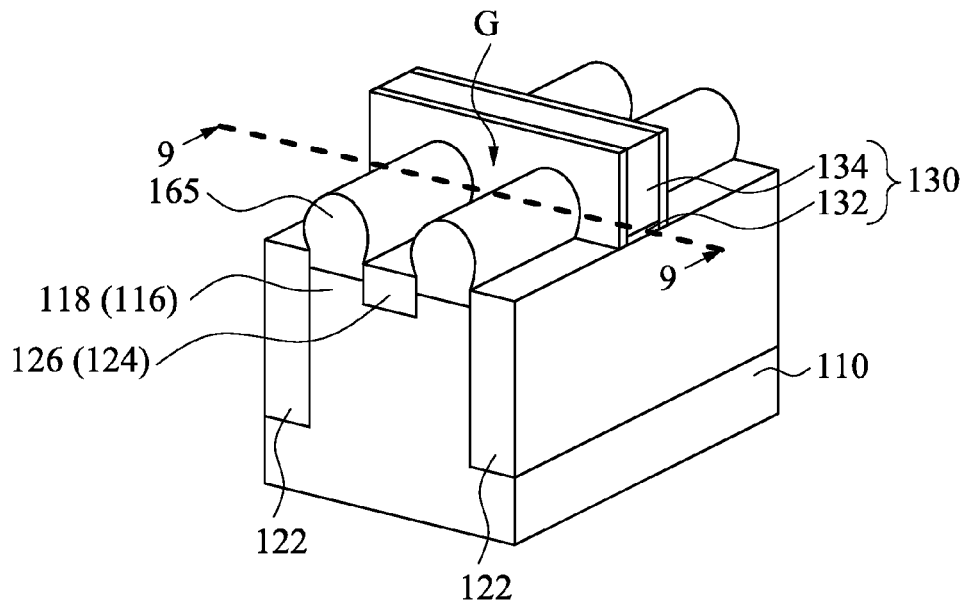
Figure 9:
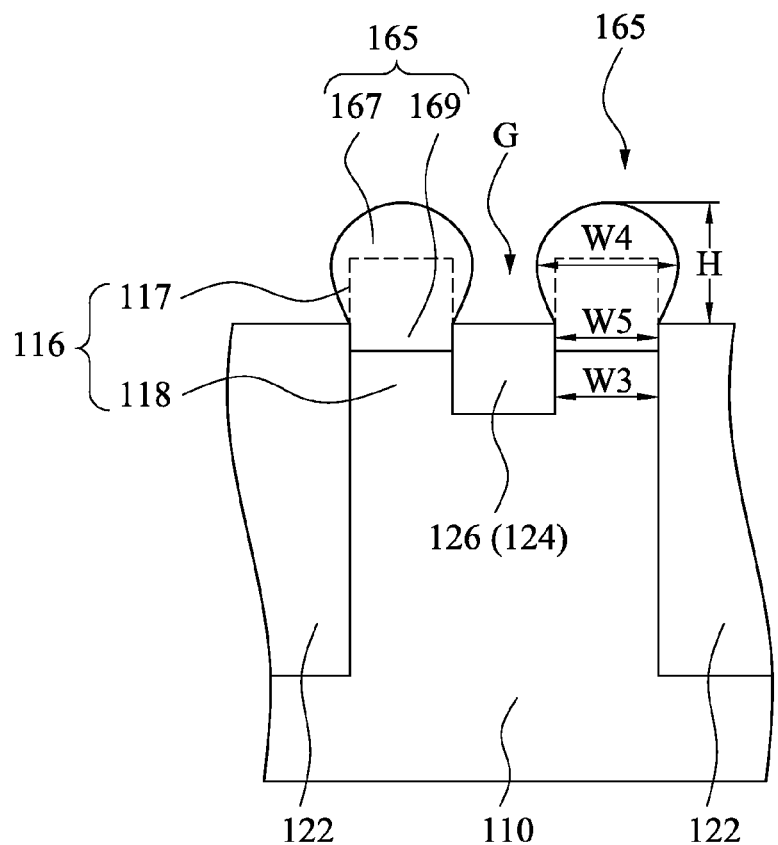
FIG. 9 is a cross-sectional view taking along line 9-9 of FIG. 8.

Reference is made to FIGS. 8 and 9, and FIG. 9 is a cross-sectional view taking along line 9-9 of FIG. 8. Parts of the epitaxy structures 160 of FIG. 6 are removed. For example, an etching back process can be performed on the epitaxy structures 160 to form epitaxy structures 165 without facet surfaces. That is, the epitaxy structures 165 have a substantially round profile (or non-facet surfaces). Furthermore, the epitaxy structures 165 are separated from each other, i.e., a gap G is formed between the epitaxy structures 165 and above the second portion 126 of the isolation structure 124. In some embodiments, etching gases such as HCl can be introduced into the same chamber as the forming of the epitaxy structures 160 of FIG. 6. In some embodiments, the epitaxy growth and the etch of epitaxy structures 160 are in-situ performed, that is, in a same process chamber with no vacuum break therebetween. During the etch step, the corners of the epitaxy structures 160 can be removed more than planar portions, and hence the surface profile of the epitaxy structures 160 is rounded. In some embodiments, after the etch step, the epitaxy structures 165 has an ellipse shape. The etch step may include, for example, introducing either HCl or the combination of HCl and GeH$_4$ into the process chamber. The wafer temperature during the etch step may be greater than about 500° C. with both HCl and GeH$_4$ being introduced, or greater than about 700° C. with HCl, but no GeH$_4$, being introduced. During the etch step, plasma may or may not be activated.

In FIG. 9, at least one of the epitaxy structures 160 has a top portion 167 and the body portion 169. The top portion 167 has a substantially round profile (or non-facet surface) and a width W4. The body portion 169 is disposed between the top portion 167 and one of the semiconductor fins 116 and has a width W5 shorter than the width W4. In some embodiments, the width W4 is shorter than the width W1 (see FIG. 7) and greater than the width W5. The width W5 is substantially equal to the width W2 (see FIG. 7) and W3. That is, although the etching process reduce the width W1 of the top portions 162 of the epitaxy structures 160, the reduced width W4 is still greater than the width W5 of the body portions 169 or 164.

Since the widths W4 of the top portions 167 of the epitaxy structure 165 are reduced, two epitaxy structures 165 can be disposed closer while they are still separated each other. That is, the distance between the semiconductor fins 116 can be reduced. Therefore, the integration density of the semiconductor device can be increased, and more elements can be accommodated in the same area.

Furthermore, at least one of the top portions 167 of the epitaxy structures 165 further has a height H. A ratio of the height H to the width W4 of the top portion 167 ranges from about 0.5 to about 4. If the ratio is not equal to 1, the top portions 167 are elliptic cylindrical shaped as shown in FIG. 8. If the ratio is substantially equal to 1, the top portions 167 are cylindrical shaped.

Figure 10:
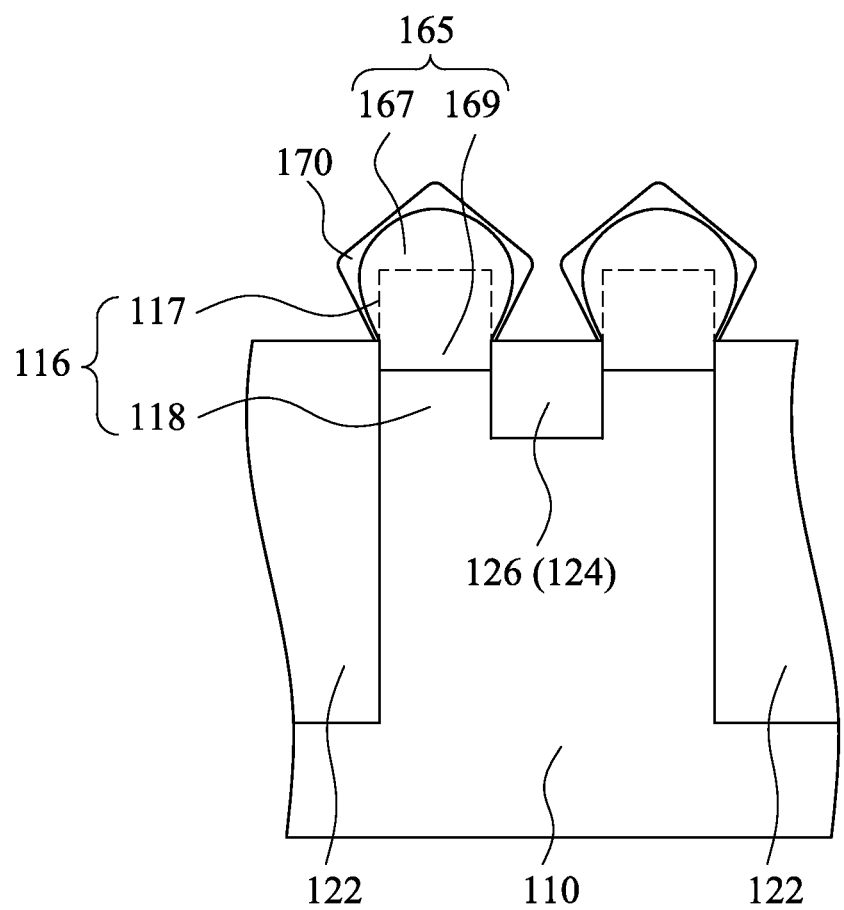
FIGS. 10 to 11 are perspective views of the method for manufacturing the semiconductor device of FIG. 9 at following stages in accordance with some embodiments of the present disclosure.
Figure 11:
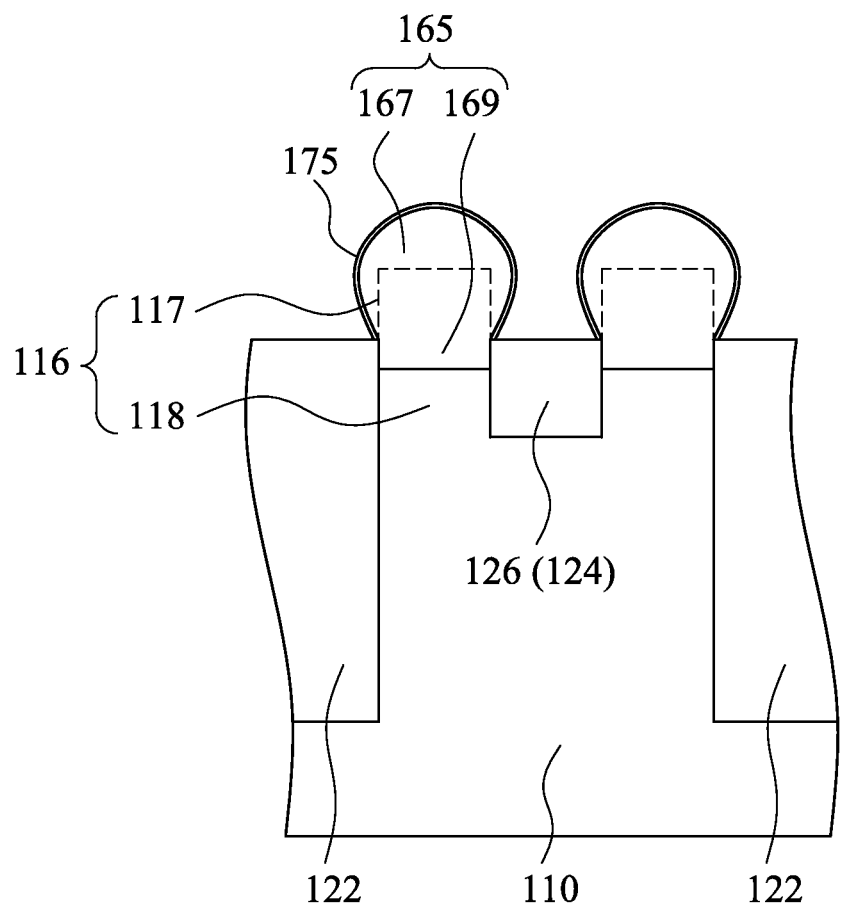

FIGS. 10 to 11 are perspective views of the method for manufacturing the semiconductor device of FIG. 9 at following stages in accordance with some embodiments of the present disclosure. In some embodiments, epitaxy layers 170 can be formed to cover the epitaxy structures 165. The epitaxy layers 170 may be formed using a similar process as the epitaxy structures 160 (discussed above with respect to FIG. 6) such as a suitable epitaxy growth process. In some embodiments, the epitaxy layers 170 and the epitaxy structures 165 can be made of substantially the same material. In some other embodiments, however, the epitaxy layers 170 and the epitaxy structures 165 can be made of different materials. In some embodiments, the epitaxy layers 170 can be made of silicon carbon (SiC), silicon germanium (SiGe), or other suitable semiconductor materials. In some embodiments, the concentration of germanium of the epitaxy layers 170 is less than about 40%.

In FIG. 10, the epitaxy layers 170 have facet surfaces, such that another etching process can be performed to smooth the surfaces of the epitaxy layers 170. Reference is made to FIG. 11. Parts of the epitaxy layers 170 are removed (or etched) to form protection layers 175. Hence, the protection layers 175 have substantially round or non-facet surfaces. The epitaxy layers 170 may be etched using a similar process as the epitaxy structures 160 (discussed above with respect to FIG. 8). The protection layers 170 can prevent the epitaxy structures 165 from damage during the following etching process(es).

The process from FIG. 10 to FIG. 11 is referred to a deposition-etching cycle. In some embodiments, more than one cycle can be performed on the epitaxy structures 165. That is, the protection layers 170 can be a multi-layer structure, and the claimed scope of the present disclosure is not limited in this respect.

According to the aforementioned embodiments, since the width of the top portion of the epitaxy structure can be reduced by removing parts of the top portion, the adjacent epitaxy structures (or the adjacent semiconductor fins) can be disposed closer, and more elements can be accommodated in the same area to increase the integration density of the semiconductor device.

According to some embodiments, a semiconductor device includes a substrate, at least one first isolation structure, at least two second isolation structures, and a plurality of epitaxy structures. The substrate has a plurality of semiconductor fins therein. The first isolation structure is disposed between the semiconductor fins. The semiconductor fins are disposed between the second isolation structures, and the second isolation structures extend into the substrate further than the first isolation structure. The epitaxy structures are respectively disposed on the semiconductor fins. The epitaxy structures are separated from each other, and at least one of the epitaxy structures has a substantially round profile.

According to some embodiments, a semiconductor device includes a substrate, at least one first isolation structure, a plurality of second isolation structures, a first epitaxy structure, and a second epitaxy structure. The substrate has a first semiconductor fin and a second semiconductor fin therein. The first isolation structure is disposed between the first semiconductor fin and the second semiconductor fin. The second isolation structures define a crown structure in the substrate. The first semiconductor fin is disposed in the crown structure and between one of the second isolation structures and the first isolation structure, the second semiconductor fin is disposed in the crown structure and between another of the second isolation structures and the first isolation structure. The first epitaxy structure is disposed on the first semiconductor fin and having a non-facet surface. The second epitaxy structure is disposed on the second semiconductor fin and has another non-facet surface. A gap is formed between the first epitaxy structure and the second epitaxy structure.

According to some embodiments, a method for manufacturing a semiconductor device is provided. At least one first isolation structure and a plurality of second isolation structures are formed in a substrate. The second isolation structures define a crown structure in the substrate, and the first isolation structure defines a plurality of semiconductor fins in the crown structure. A gate stack is formed overlaying first portions of the semiconductor fins and a first portion of the first isolation structure while leaving second portions of the semiconductor fins and a second portion of the first isolation structure uncovered. Parts of the second portions of the semiconductor fins are removed. A plurality of epitaxy structures are formed on the remaining second portions of the semiconductor fins. Parts of the epitaxy structures are removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate having first and second semiconductor fins therein;
   at least one first isolation structure disposed between the first and second semiconductor fins;
   at least two second isolation structures, wherein the first and second semiconductor fins are disposed between the second isolation structures, and the second isolation structures extend into the substrate further than the first isolation structure;
   a gate stack on first portions of the first and second semiconductor fins while leaving second portions of the first and second semiconductor fins uncovered by the gate stack, wherein a top surface of the second portion of the first semiconductor fin is below a top surface of the first isolation structure;
   first and second epitaxy structures respectively disposed on the second portions of the first and second semiconductor fins, wherein the first and second epitaxy structures are separated from each other, each of the first and second epitaxy structures includes a top portion and a body portion between the top portion a respective one of the first and second semiconductor fins, the top portion includes a sidewall that has an outwardly curved surface portion and that extends from the body portion, and the outwardly curved surface portions of the first and second epitaxy structures face each other and define a gap therebetween over the first isolation structure; and
   a protection layer formed conformally on the first epitaxy structure and extending from a junction of the top portion and the body portion of the first epitaxy structure.

2. The semiconductor device of claim 1, wherein
   the top portion has a first width and
   wherein the body portion has a second width shorter than the first width.

3. The semiconductor device of claim 2, wherein the top portion of the first epitaxy structure further has a height, and a ratio of the height to the first width of the top portion ranges from about 0.5 to about 4.

4. The semiconductor device of claim 2, wherein the top portion is elliptic cylindrical shaped or cylindrical shaped.

5. The semiconductor device of claim 2, wherein the first isolation structure, one of the second isolation structures, and the first semiconductor fin disposed between the first isolation structure and said one of the second isolation structures together form a recess, and the body portion of the first epitaxy structure is disposed in the recess.

6. The semiconductor device of claim 1, wherein the first isolation structure comprises a first portion and a second portion, and the gate stack covers the first portion of the first isolation structure while leaving the second portion of the first isolation structure uncovered.

7. The semiconductor device of claim 6, wherein the second portion of the first isolation structure is disposed between the first and second epitaxy structures.

8. The semiconductor device of claim 6, wherein the first epitaxy structure is higher than or substantially equal to a portion of at least one of the first and second semiconductor fins covered by the gate stack.

9. A method for manufacturing a semiconductor device, comprising:
   forming a first portion of a first isolation structure and a first portion of a plurality of second isolation structures in a substrate at the same time, wherein the second isolation structures define a crown structure in the substrate, and the first isolation structure defines first and second semiconductor fins in the crown structure;
   forming a gate stack overlaying first portions of the first and second semiconductor fins and a first portion of the first isolation structure while leaving second portions of the first and second semiconductor fins and a second portion of the first isolation structure uncovered by the gate stack;
   removing parts of the second portions of the first and second semiconductor fins such that a top surface of the second portion of the first semiconductor fin is below a top surface of the first isolation structure;
   forming first and second epitaxy structures on the remaining second portions of the first and second semiconductor fins; and
   removing parts of the first and second epitaxy structures above the first isolation structure and leaving the first and second epitaxy structures respectively having outwardly curved surface portions facing each other and defining a gap therebetween over the first isolation structure.

10. The method of claim 9, wherein the forming the first portion of the first isolation structure and the first portion of the second isolation structures comprises:
    forming at least one first trench and a plurality of second trenches in the substrate, wherein the second trenches are deeper than the first trench.

11. The method of claim 9, further comprising:
    conformally forming a protection layer to cover at least one of the first and second epitaxy structures.

12. The method of claim 11, wherein the conformally forming comprises:
    forming an epitaxy layer to cover said at least one of the first and second epitaxy structures; and
    removing at least a part of the epitaxy layer to form the protection layer.

13. The method of claim 9, further comprising forming a second portion of the first isolation structure after forming a second portion of the second isolation structures.

14. A method for manufacturing a semiconductor device, comprising:
    removing portions of a substrate to form a pair of first trenches in the substrate;
    simultaneously forming a second trench in the substrate between the first trenches and deepening the first trenches to form a pair of semiconductor fins;
    forming an isolation structure in the first and second trenches;
    forming a gate stack over the semiconductor fins;
    growing epitaxy structures on the semiconductor fins; and
    rounding sidewalls of the epitaxy structures.

15. The method of claim 14, further comprising removing portions of the epitaxy structures such that each of the epitaxy structures has a height and a width less than the height.

16. The method of claim 14, further comprising removing portions of the epitaxy structures such that each of the epitaxy structures has a height and a width substantially equal to the height.

17. The method of claim 14, further comprising removing portions of the epitaxy structures such that each of the epitaxy structures has a height and a width greater than the height.

18. The method of claim 14, further comprising growing epitaxy layers on the epitaxy structures.

19. The method of claim 18, further comprising removing portions of the epitaxy layers such that the epitaxy layers are formed conformally on the epitaxy structures.

20. The method of claim 19, wherein removing portions of the epitaxy layers is such that each of the epitaxy layers extends from a junction of the isolation structure and a respective one of the epitaxy structures.

\* \* \* \* \*